United States Patent
Vielemeyer et al.

(10) Patent No.: US 9,530,773 B2
(45) Date of Patent: *Dec. 27, 2016

(54) SYSTEMS AND METHODS FOR INTEGRATING BOOTSTRAP CIRCUIT ELEMENTS IN POWER TRANSISTORS AND OTHER DEVICES

(71) Applicant: Infineon Technologies Austria AG, Villach (AT)

(72) Inventors: Martin Vielemeyer, Villach (AT); Sylvain Leomant, Villach (AT); Milko Paolucci, Villach (AT); Martin Poelzl, Ossiach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 14/918,034

(22) Filed: Oct. 20, 2015

(65) Prior Publication Data

US 2016/0043072 A1 Feb. 11, 2016

Related U.S. Application Data

(63) Continuation of application No. 13/718,775, filed on Dec. 18, 2012, now Pat. No. 9,171,738.

(51) Int. Cl.
*H01L 27/06* (2006.01)
*H01L 21/385* (2006.01)
(Continued)

(52) U.S. Cl.
CPC ........... *H01L 27/0629* (2013.01); *H01L 21/38* (2013.01); *H01L 21/385* (2013.01);
(Continued)

(58) Field of Classification Search
CPC ..... H01L 27/06; H01L 27/0617; H01L 27/0629
See application file for complete search history.

(56) References Cited

U.S. PATENT DOCUMENTS

| | | | |
|---|---|---|---|
| 3,649,843 A | 3/1972 | Redwine et al. | |
| 9,171,738 B2* | 10/2015 | Vielemeyer | ......... H01L 27/0629 |
| | (Continued) | | |

FOREIGN PATENT DOCUMENTS

| | | |
|---|---|---|
| CN | 1873948 A | 12/2006 |
| CN | 101500365 A | 8/2009 |
| | (Continued) | |

OTHER PUBLICATIONS

Infineon, IFX91041 Data Sheet, Jul. 8, 2011, 17 pp.
(Continued)

*Primary Examiner* — Eduardo A Rodela
(74) *Attorney, Agent, or Firm* — Shumaker & Sieffert, P.A.

(57) ABSTRACT

Embodiments relate to bootstrap circuits integrated with at least one other device, such as a power transistor or other semiconductor device. In embodiments, the bootstrap circuit can comprise a bootstrap capacitor and a bootstrap diode, or the bootstrap circuit can comprise a bootstrap capacitor and a bootstrap transistor. The bootstrap capacitor comprises a semiconductor-based capacitor, as opposed to an electrolytic, ceramic or other capacitor, in embodiments. The integration of the bootstrap circuit with another circuit or device, such as a power transistor device in one embodiment, is at a silicon-level in embodiments, rather than as a module-like system-in-package of conventional approaches. In other words, the combination of the bootstrap circuit elements and power transistor or other device forms a system-on-silicon, or an integrated circuit, in embodiments, and additionally can be arranged in a single package.

19 Claims, 15 Drawing Sheets

(51) Int. Cl.
*H01L 21/38* (2006.01)
*H01L 23/64* (2006.01)
*H01L 27/07* (2006.01)
*H01L 21/8234* (2006.01)
*H03K 17/687* (2006.01)

(52) U.S. Cl.
CPC .......... *H01L 21/8234* (2013.01); *H01L 23/64* (2013.01); *H01L 23/642* (2013.01); *H01L 23/645* (2013.01); *H01L 27/0676* (2013.01); *H01L 27/0705* (2013.01); *H01L 27/0711* (2013.01); *H03K 17/6871* (2013.01); *H01L 2924/0002* (2013.01)

(56) References Cited

U.S. PATENT DOCUMENTS

| | | |
|---|---|---|
| 2002/0024091 A1 | 2/2002 | Mo |
| 2005/0189603 A1 | 9/2005 | Inao et al. |
| 2008/0009112 A1 | 1/2008 | Lee et al. |
| 2008/0136390 A1 | 6/2008 | Briere |
| 2011/0165755 A1 | 7/2011 | Zundel et al. |
| 2011/0241170 A1 | 10/2011 | Haeberlen et al. |
| 2012/0049263 A1 | 3/2012 | Lin |
| 2013/0062706 A1 | 3/2013 | Standing |
| 2013/0093053 A1 | 4/2013 | Toyoda et al. |
| 2013/0140673 A1 | 6/2013 | Haeberlen et al. |
| 2013/0264953 A1 | 10/2013 | Cavallini |
| 2014/0048871 A1 | 2/2014 | Zundel et al. |
| 2014/0167069 A1 | 6/2014 | Vielemeyer et al. |

FOREIGN PATENT DOCUMENTS

| | | |
|---|---|---|
| EP | 1729338 A2 | 12/2006 |
| JP | 2012029361 A | 2/2012 |

OTHER PUBLICATIONS

Infineon, High-Performance DrMOS Datasheet TDA21220, Mar. 31, 2011, 26 pp.

Fair Child Semiconductor, FDMF6704-XS DrMOS, The Xtra Small, High Performance, High Frequency DrMOS Module, Aug. 2009, 14 pp.

Prosecution History from U.S. Appl. No. 13/718,775, dated Jan. 15, 2014 through Jun. 25, 2015, 92 pp.

* cited by examiner

SYSTEMS AND METHODS FOR INTEGRATING BOOTSTRAP CIRCUIT ELEMENTS IN POWER TRANSISTORS AND OTHER DEVICES

This application is a Continuation of U.S. application Ser. No. 13/718,775, filed Dec. 18, 2012, the entire content of which is incorporated herein by reference.

TECHNICAL FIELD

The invention relates generally to integrated circuits and more particularly to integrating bootstrap circuit elements in power transistors and other integrated circuit devices.

BACKGROUND

Some integrated circuits, such as driver circuits for power transistors, require bootstrap circuits to function most effectively. In one example, a bootstrap circuit comprises a capacitor and a diode and functions to provide voltage, stored in the capacitor, in addition to the supply voltage such that there is sufficient power to bias a transistor into linear operation. In another example, a bootstrap circuit comprises a capacitor and a transistor.

Bootstrap circuits typically are provided in addition to the package housing the power transistor or other integrated circuitry, though sometimes at least a portion of the bootstrap circuit is provided in the same package. For example, system-in-package configurations can comprise a bootstrap circuit module or similar configuration in which the bootstrap circuit is provided along with other modules in a single package, though the bootstrap circuit still remains at least partially distinct from the other modules within the package.

Complete integration of entire bootstrap circuits, however, remains a challenge, particularly with respect to true silicon-level integration of both a semiconductor-based bootstrap capacitor and the bootstrap diode, or a bootstrap transistor, with other circuit elements, such as power transistors and other devices. Challenges exist in further silicon-level integration of the bootstrap circuit elements with the power transistor or other circuitry to, e.g., save space and costs and provide simplified solutions, at least because of the range of bootstrap capacitances needed.

SUMMARY

Embodiments relate to integrating bootstrap circuit elements in power transistor and/or other integrated circuit devices.

In an embodiment, a semiconductor device comprises a package; and an integrated circuit arranged in the package and comprising at least one transistor device and a bootstrap circuit being coupled with one another, the bootstrap circuit comprising a semiconductor-based bootstrap capacitor device.

In an embodiment, an integrated circuit comprises a semiconductor power transistor; and a circuit comprising a semiconductor capacitor monolithically formed with the semiconductor power transistor.

In an embodiment, a method comprises forming at least one transistor device; and forming a semiconductor-based bootstrap capacitor element monolithically with the at least one transistor device; and disposing the monolithically-formed at least one transistor device and bootstrap capacitor element in a package.

Those skilled in the art will recognize additional features which can be included as well as advantages of embodiments upon reading the following description and viewing the accompanying drawings.

BRIEF DESCRIPTION OF THE DRAWINGS

The invention may be more completely understood in consideration of the following detailed description of various embodiments of the invention in connection with the accompanying drawings, in which.

Figure 1:
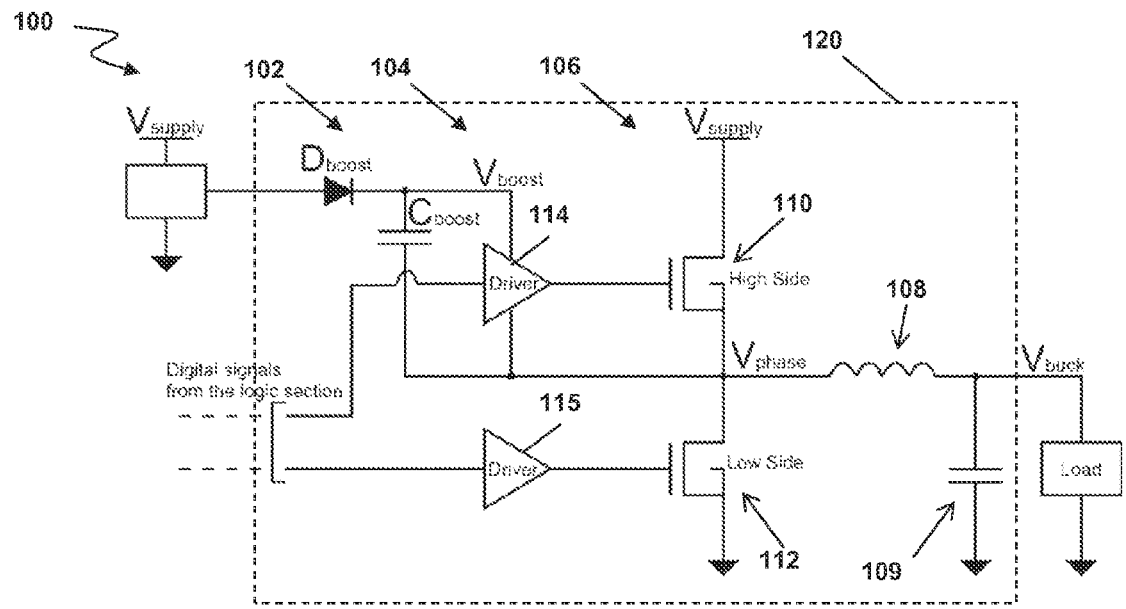
FIG. 1 is a block diagram of a floating driver circuit including a bootstrap circuit according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to bootstrap circuits integrated monolithically and/or in the same package as at least one other device, such as a MOSFET, SiC or GaN transistor device, and/or some other semiconductor device. In one embodiment, the transistor device comprises a power transistor device. In embodiments, the bootstrap circuit can comprise a bootstrap capacitor and a bootstrap diode, or the bootstrap circuit can comprise a bootstrap capacitor and a bootstrap transistor. The bootstrap capacitor comprises a semiconductor-based capacitor, as opposed to an electrolytic, ceramic or other capacitor, in embodiments. The integration of the bootstrap circuit with another circuit or device, such as a power transistor device in one embodiment, is at a silicon-level in embodiments, rather than as a module-like system-in-package of conventional approaches. In other words, the combination of the bootstrap circuit elements and power transistor or other device forms a system-on-silicon, or an integrated circuit, in embodiments, and additionally can be arranged in a single package. Advantages of embodiments include reduced area requirements and costs, simplification of assembly and board layout design, decreased parasitic effects and a related increase in efficiency, and a simplified supply chain for the end user, among others.

Referring to FIG. 1, a floating driver buck converter circuit 100 is depicted. Circuit 100 can comprise other circuit types or elements in other embodiments, such as some other MOSFET circuit, SiC device such as a jFET, GaN device such as a high electron mobility transistor (HEMT), or some other integrated circuit or semiconductor device. Circuit 100 comprises a bootstrap circuitry 102, driver circuitry 104, MOSFET circuitry 106 and an output inductor 108 and capacitor 109. Though depicted and referred to as single circuitries, each circuitry portion can in fact comprise separate circuits or circuit portions, coupled appropriately, in embodiments. For example, driver circuitry 104 can comprise a high side portion 114 and a low side portion 115 in an embodiment. The circuitry portions referred to herein and in FIG. 1 therefore are not limiting and are used herein for illustrative purposes. Moreover, the particular example circuitry portions can be supplemented by or substituted with other circuitry in some embodiments, even though particular examples are depicted and discussed.

The reference point of driver circuitry 104 is set to the source of a high-side transistor 110. Such driver circuitry 104 is often referred to as floating driver, which can provide benefits in many implementations, including lower breakdown voltage, $BV_{DSS}$, for the driving stage, as well as the ability to use a single power supply for both the high- and low-side transistors 110 and 112. In embodiments, transistors 110 and 112 comprise power transistors.

Many buck converters, however, use additional components, such as bootstrap circuitry 102. In an embodiment, bootstrap circuitry 102 comprises a capacitor, $C_{boost}$, and diode, $D_{boost}$. In other embodiments, $D_{boost}$ can be replaced by a bootstrap transistor, which is discussed herein below. $C_{boost}$ provides a floating power supply for a high-side driver 114, acting as an energy storage element, while $D_{boost}$ acts as a block element for the floating voltage. In an embodiment, $D_{boost}$ comprises a Schottky diode. $C_{boost}$ comprises a semiconductor-based capacitor in embodiments, rather than an electrolytic, ceramic or other capacitor type.

In operation, during the on-time of low-side transistor 112, the $C_{boost}$ is charged to the driving voltage via $D_{boost}$. Once the on-time of high-side transistor 110 begins, the charge stored in $C_{boost}$ is transferred through driver 114 to an input capacitor of the high side transistor 110. While high side transistor 110 is turning on, the voltage at the source potential is rising; assuming $C_{boost}$ is not discharging, the voltage at the cathode of $D_{boost}$ will also rise. As such, the two voltages will rise simultaneously until high side transistor 110 is completely turned on, creating a "floating" power supply.

In embodiments, $C_{boost}$ and $D_{boost}$ are integrated with at least one of driver portion 104 and MOSFET portion 106. In one embodiment, $C_{boost}$ and $D_{boost}$ are integrated with portions 104 and 106 in the same package 120. Package 120 can also include other circuits, circuit portions and elements, in embodiments.

Figure 2A:
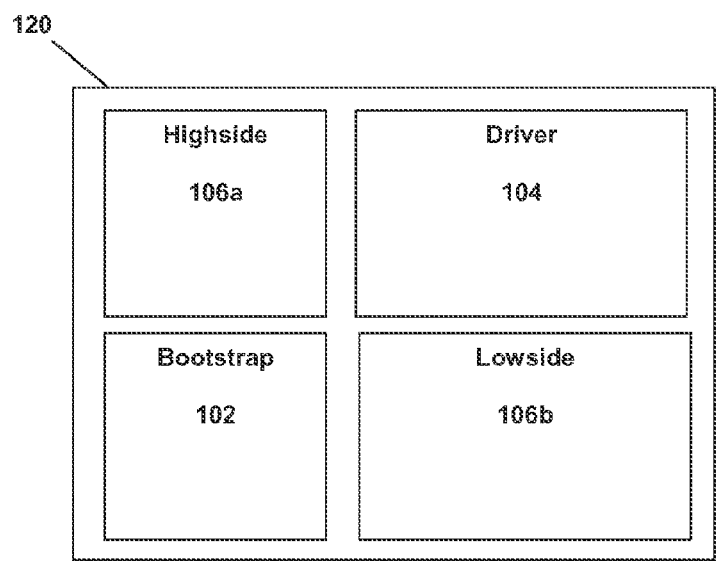
FIG. 2A is a block diagram of a bootstrap circuit integration layout according to an embodiment.
Figure 2B:
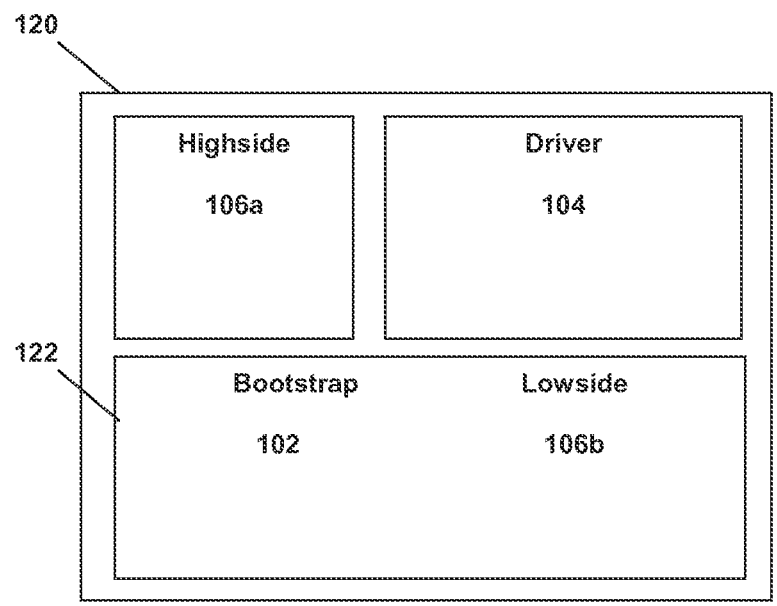
FIG. 2B is a block diagram of a bootstrap circuit integration layout according to an embodiment.
Figure 2C:
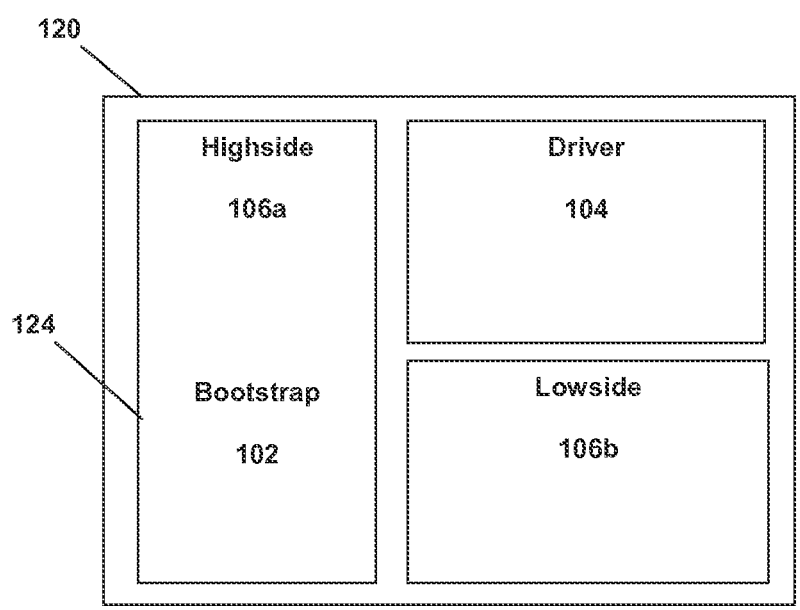
FIG. 2C is a block diagram of a bootstrap circuit integration layout according to an embodiment.
Figure 2D:
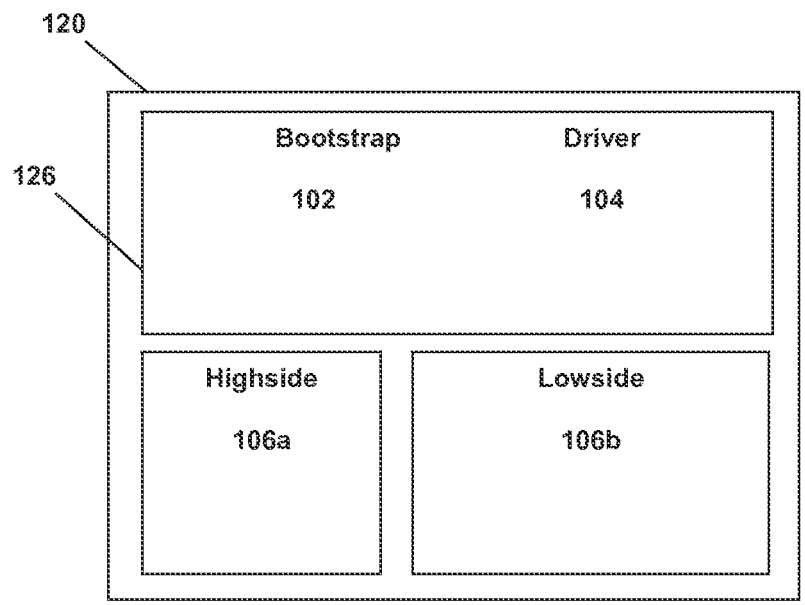
FIG. 2D is a block diagram of a bootstrap circuit integration layout according to an embodiment.

For example, in FIG. 2A a highside circuitry 106a, driver circuitry 104, bootstrap circuitry 102 and a lowside circuitry 106b are integrated in package 120. In an embodiment, each circuitry portion as depicted is implemented on a separate silicon die. In other embodiments, one or more portions can be further integrated. For example, in FIG. 2B, bootstrap circuitry 102 and lowside circuitry 106b are arranged on the same die 122. In FIG. 2C, highside circuitry 106a and bootstrap circuitry 102 are arranged on the same die 124, while in FIG. 2D bootstrap circuitry 102 and driver circuitry 104 are arranged on die 126. Other arrangements can be implemented in other embodiments. For example, highside circuitry 106a, driver 104 and bootstrap circuitry 102 can be implemented on a single die in an embodiment. The particular combination can vary according to an application, technology, or some other factor. For example, the embodiment of FIG. 2C can be advantageous because bootstrap circuitry 102 supports the drive of highside circuitry 106a, but the embodiment of FIG. 2B can be easier to implement technologically. In another embodiment, $C_{boost}$ and $D_{boost}$ are monolithically integrated with another circuit portion. In yet another embodiment, one or more of the portions depicted in FIGS. 2A-2D can be stacked vertically with another of the portions or some other circuitry, one die on top of another. Regardless of the particular arrangement, however, bootstrap portion 102 is integrated in package 120 with other circuit portions in embodiments.

In still other embodiments, bootstrap circuitry 102 can be monolithically integrated with other circuit portions. In embodiments, this can be accomplished using lateral MOSFET technologies, techniques using Gallium nitride (GaN) and silicon carbide (SiC), and others. In an example embodiment, power MOSFET technology is used, such as a process flow of a split trench power MOSFET, though other technologies and techniques can also have advantages. For example, lateral MOSFET can be inexpensive with respect to price per area and provide a higher degree of freedom with respect to rewiring, even though additional processes can be needed for the bootstrap circuit, which increases cost. Materials like GaN and SiC can be advantageous in high frequency applications. Regardless of the technology used, various embodiments provide opportunities for monolithically integrated bootstrap circuit elements in addition to the aforementioned package-level integration embodiments.

In a floating driver embodiment, such as that discussed with respect to FIGS. 1 and 2C in which bootstrap portion 102 is integrated with highside portion 106a, integration of bootstrap portion 102 generally comprises three stages in embodiments: a capacitor stage, a diode or transistor stage, and an electrical connection stage in which high-side transistor 110 is coupled with bootstrap portion 102. Though the stages can be carried out in this order, they need not be in all embodiments.

Figure 3:
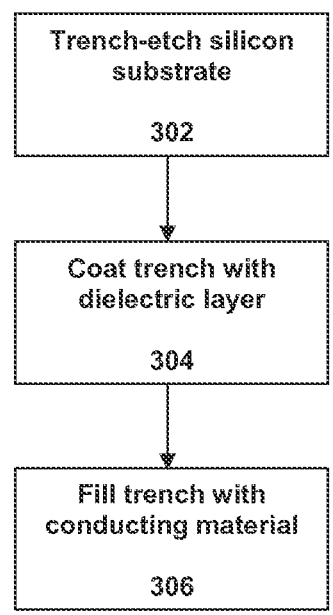
FIG. 3 is a flowchart of a method of forming a trench according to an embodiment.

In an embodiment of the capacitor stage, a trench is used to form $C_{boost}$. The trench can be the same as or different from other trenches used in the power MOSFET, which in an embodiment can comprise an n-channel MOSFET. Referring to FIG. 3, in an embodiment a trench is etched into a silicon substrate at 302. At 304, the trench is coated with a dielectric layer, such as silicon oxide, silicon nitride, a combination thereof, or some other dielectric, such as one with a dielectric constant higher than that of silicon oxide, and at 306 a conducting material, such as highly doped silicon, fills the trench. A capacitor formed in this manner can be suitable for low-side integration in embodiments.

Figure 4A:
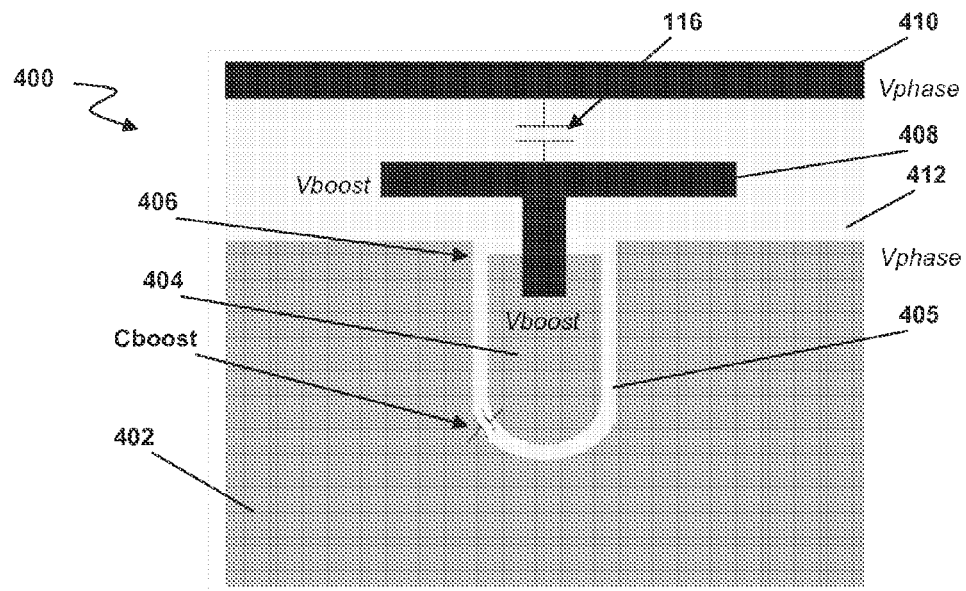
FIG. 4A is a side cross-sectional view of a bootstrap capacitor according to an embodiment.

An example of such a capacitor 400 is depicted in FIG. 4A. Capacitor 400 is integrated with the low-side in the embodiment of FIG. 4A, with the bootstrap capacitor, $C_{boost}$, formed between the bulk electrode 402, comprising silicon in an embodiment, and an electrode formed by filling trench 406 with a conductive material 404. A dielectric layer 405 separates the bulk electrode 402 and the electrode formed by the material 404 filling trench 406. A parasitic capacitance 116 can form between first and second metal layers 408 and 410, though this capacitance 116 can be a good though often negligible portion of $C_{boost}$. Insulating layer 412 between the metal layers can comprise silicon oxide, silicon nitride, oxide, nitride or some other suitable insulator material in embodiments. In another embodiment, a nitride layer can be added to trench 406, such that it comprises an oxide-nitride-oxide stack between bulk electrode 402 and electrode 404.

Figure 4B:
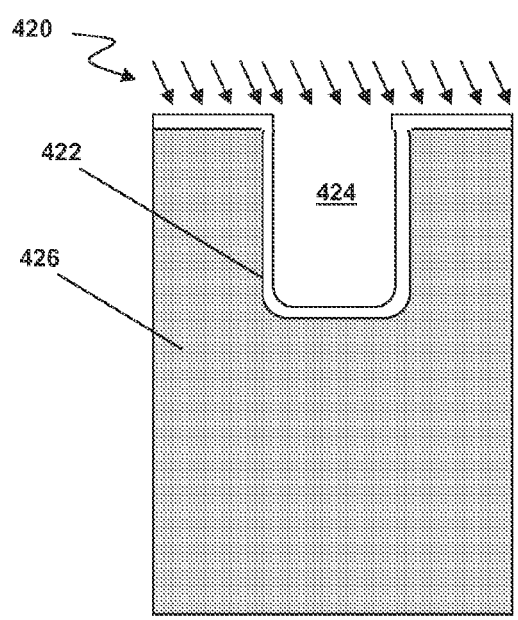
FIG. 4B is a side cross-sectional view of an implantation process according to an embodiment.
Figure 4C:
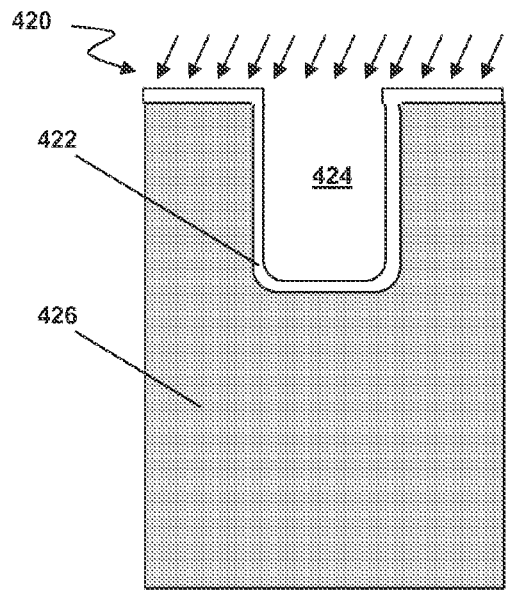
FIG. 4C is a side cross-sectional view of an implantation process according to an embodiment.

Referring to FIGS. 4B and 4C, a trench capacitor 420 similar to capacitor 400 also can comprise a scattering oxide 422 which isolates the trench 424 from the drain potential of the n-type substrate 426 typically coupled to the supply voltage in use, such that capacitor 420 is suitable for high-side integration. Thus, in an embodiment, capacitor 420 comprises a p-well around trench 424. The p-well can be formed in several different ways. For example, implantation after trench etching can be carried out, such as titled implantation as depicted in FIGS. 4B and 4C in order to sufficiently reach the sides of trench 404. In FIG. 4B, implantation from a first direction takes place, followed by implantation from a second direction in FIG. 4C. The particular tilt angle of implantation can vary in embodiments.

In another embodiment, the sides of trench 424 can be formed at an angle, such as being generally sloping inward toward the bottom of the trench or "V"-shaped on the sides. Tilted implantation is then generally not necessary, as vertical implantation will reach the sloped sides as well as the bottom of the trench. In other embodiments, a doped material can be deposited, followed by a diffusion process and subsequent removal. For example, in one embodiment a doped material is simply deposited. In another embodiment, a first layer is deposited, then a doped layer is deposited. A thermal step is carried out to drive the dopant from the doped layer through the first layer to create the well. For example, if the doped layer is p-doped, this process creates a p-doped well, after which the doped and first layers can be removed. In other embodiments, the n and p arrangement can be reversed, and this is true in this and other embodiments discussed herein. Trench 424 can be filled with a conducting material to complete the capacitor 420.

Figure 4D:
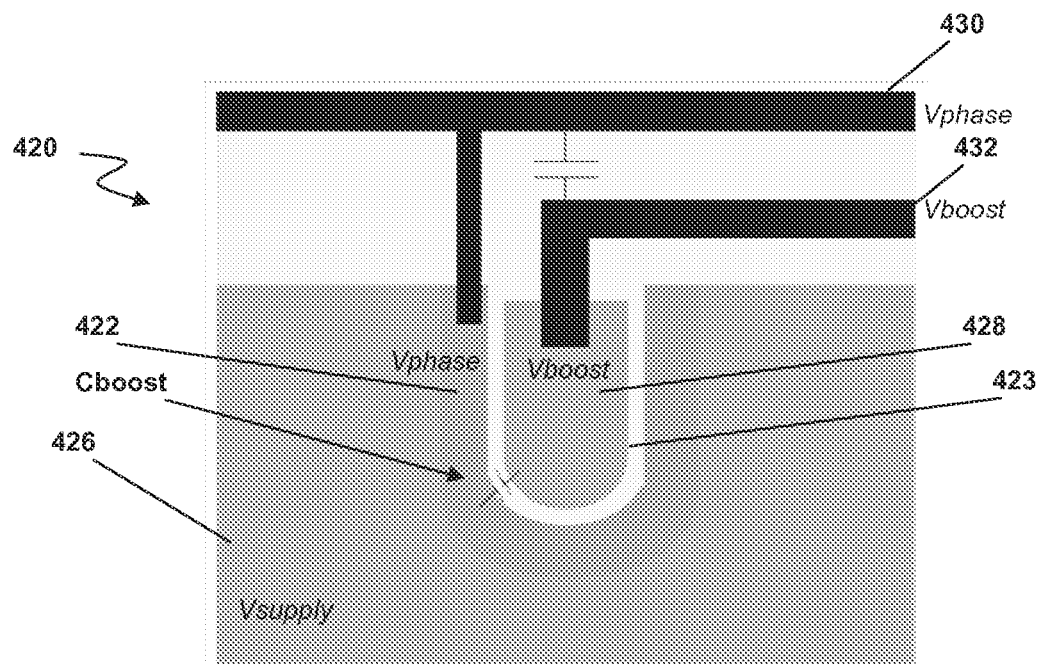
FIG. 4D is a side cross-sectional view of a high-side-integrated bootstrap capacitor according to an embodiment.
Figure 4E:
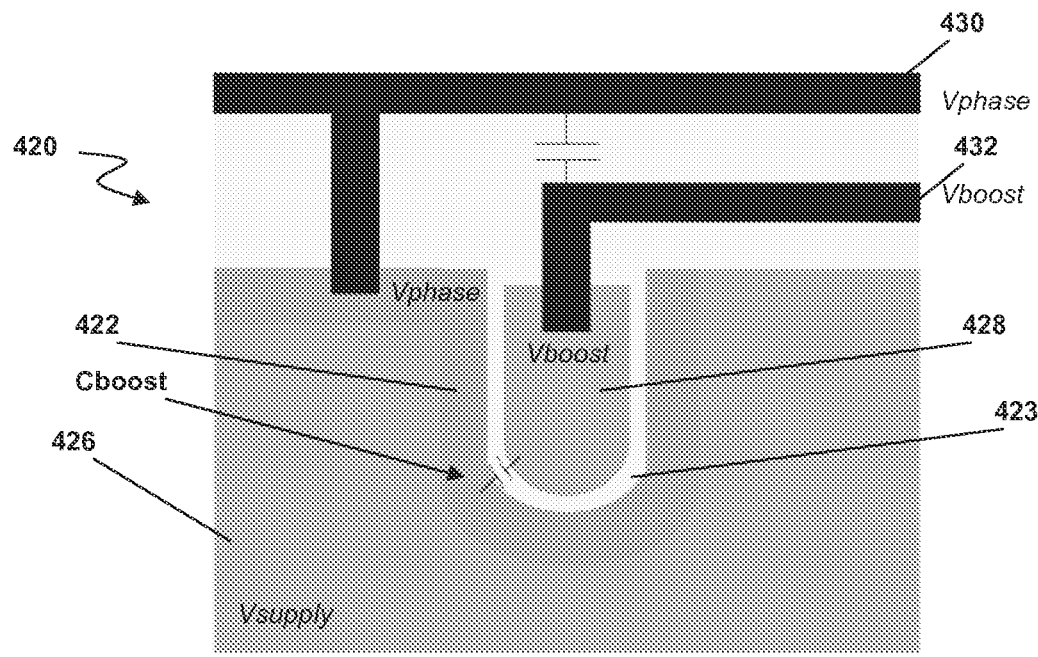
FIG. 4E is a side cross-sectional view of a high-side-integrated bootstrap capacitor according to an embodiment.

Other embodiments of capacitor 420 are depicted in FIGS. 4D and 4E. In FIG. 4D, capacitor 420 comprises two metallization layers 430 and 432 to couple to the two electrodes 422 and 428, with the capacitance depicted therebetween again being a potential additional component of $C_{boost}$. In other embodiments, a single metallization can be implemented. In FIG. 4E, isolation layer 422 is extended for a different coupling arrangement with metallization layer 430.

In embodiments, $C_{boost}$ is about 100 nF to about 200 nF. In other embodiments, the capacity of $C_{boost}$ can be larger or smaller, such as in a range of about 50 nF to about 1 µF in embodiments, or in a range of about 200 nF to about 1 µF in other embodiments. The size of $C_{boost}$ can depend in embodiments on the high side input capacitance. Thus, it is possible in embodiments for $C_{boost}$ to be even smaller than the aforementioned example and non-limiting ranges as silicon technologies improve and/or other materials, such as a GaN, are implemented. The size and other features of $C_{boost}$ can be optimized in embodiments according to available area and demands of the other circuitry portions 104 and 106, for example. In embodiments, optimizations of the trench, dielectric and conducting electrode, among others, can be carried out as discussed below.

Figure 5A:
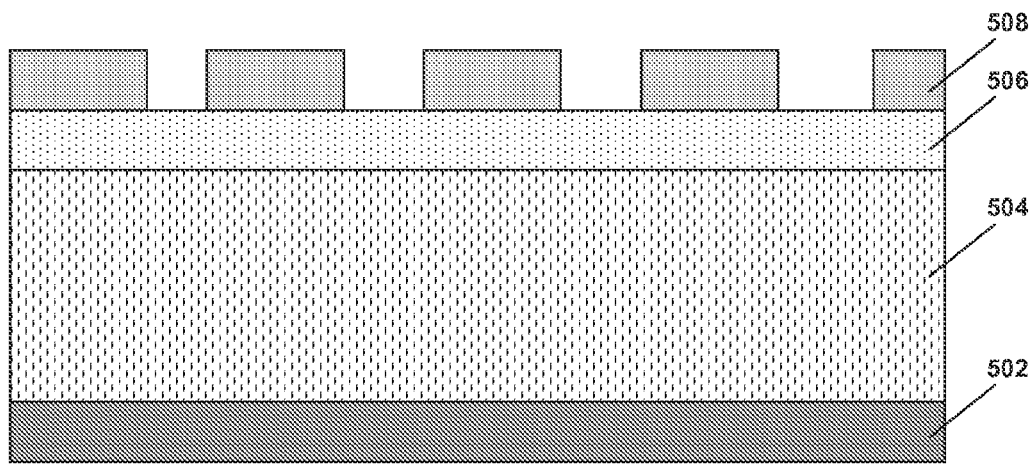
FIG. 5A is a side cross-sectional view of a process stage of forming trenches with different etch processes according to an embodiment.
Figure 5B:
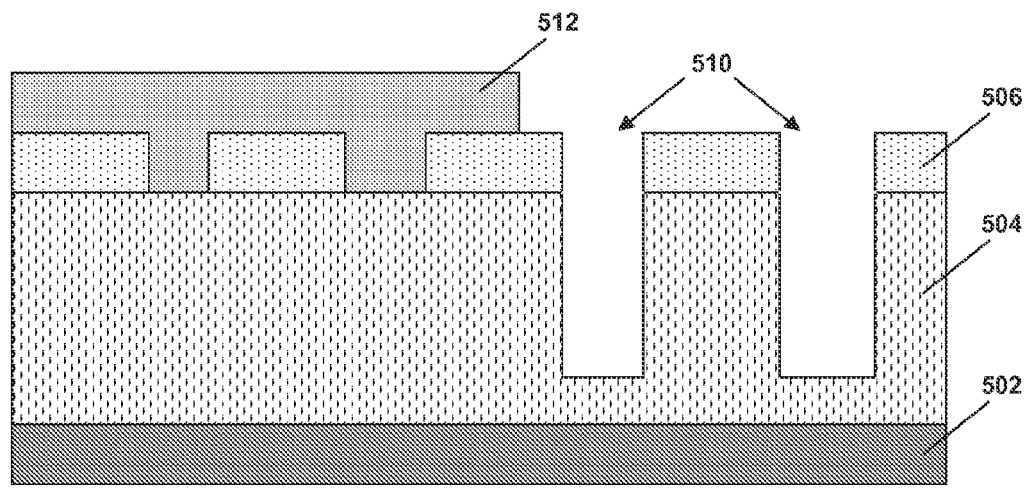
FIG. 5B is a side cross-sectional view of a process stage of forming trenches with different etch processes according to an embodiment.
Figure 5C:
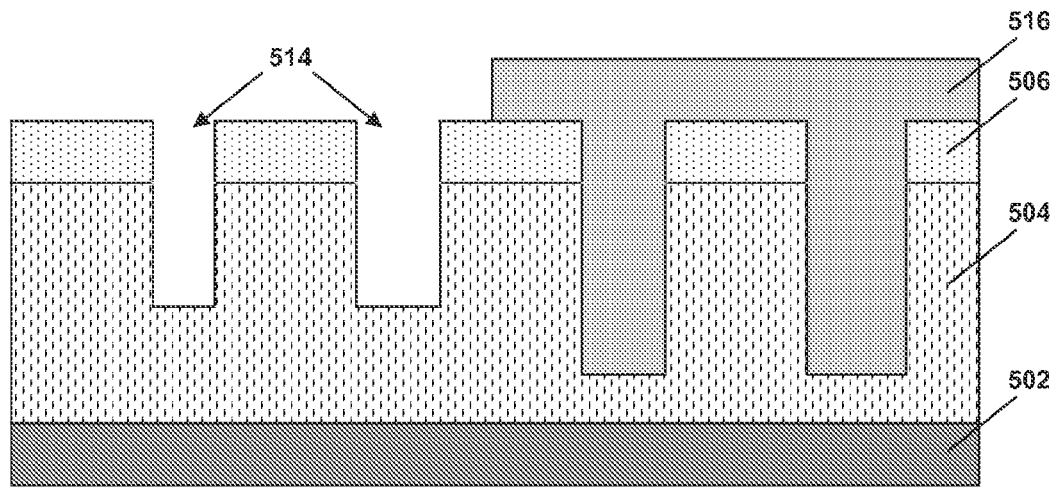
FIG. 5C is a side cross-sectional view of a process stage of forming trenches with different etch processes according to an embodiment.
Figure 5D:
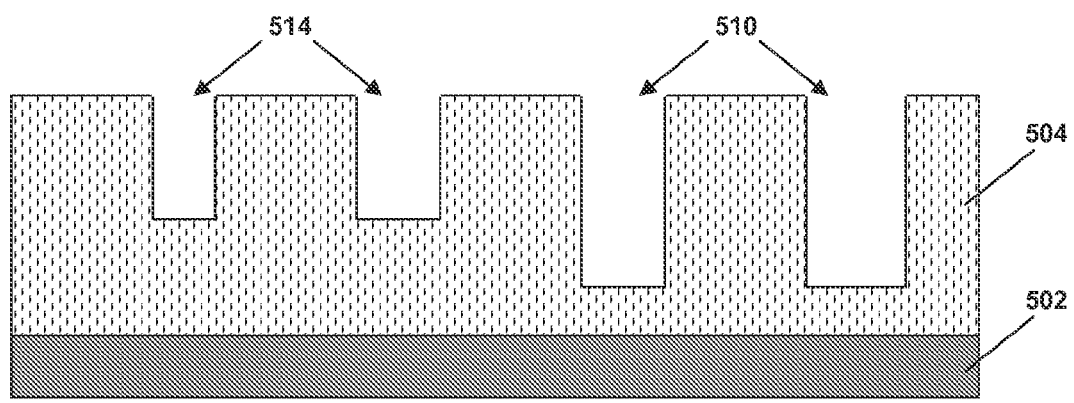
FIG. 5D is a side cross-sectional view of a process stage of forming trenches with different etch processes according to an embodiment.
Figure 6A:
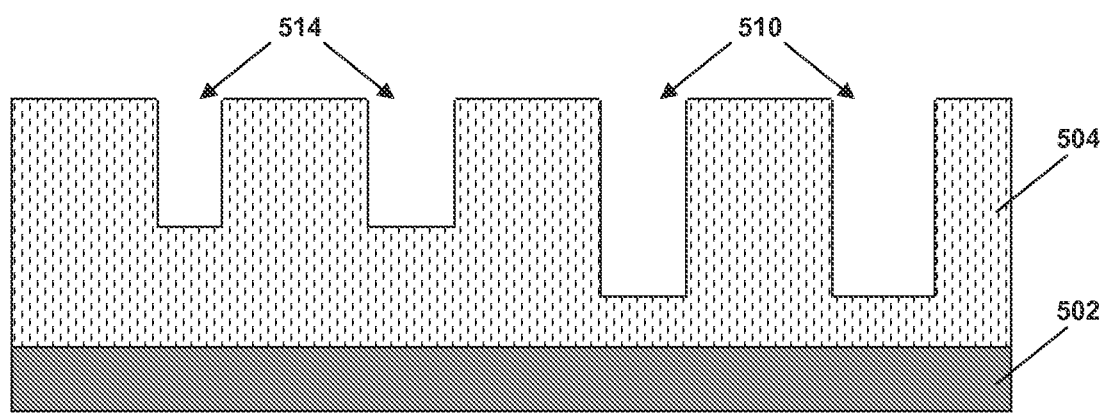
FIG. 6A is a side cross-sectional view of a process stage of forming an integrated bootstrap capacitor according to an embodiment.
Figure 6B:
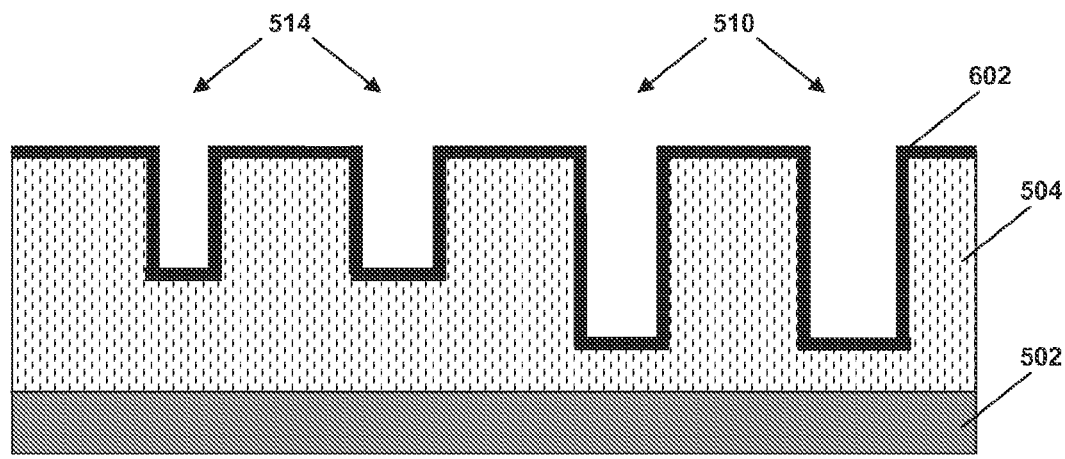
FIG. 6B is a side cross-sectional view of a process stage of forming an integrated bootstrap capacitor according to an embodiment.
Figure 6C:
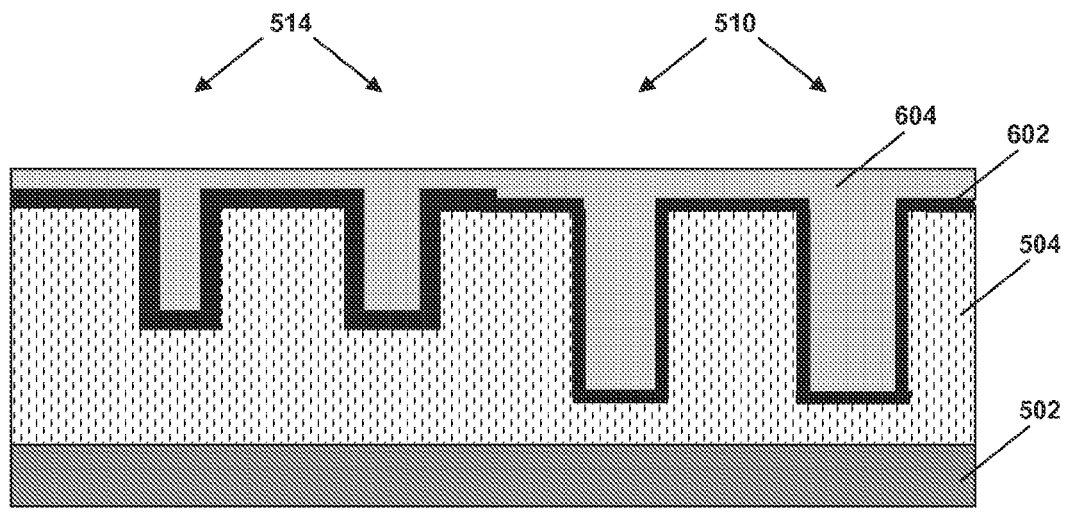
FIG. 6C is a side cross-sectional view of a process stage of forming an integrated bootstrap capacitor according to an embodiment.
Figure 6D:
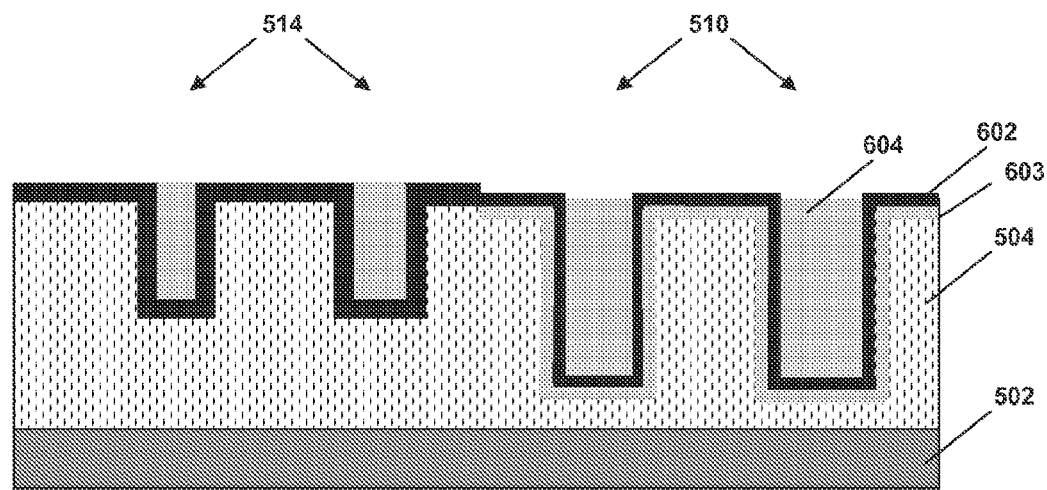
FIG. 6D is a side cross-sectional view of a process stage of forming an integrated bootstrap capacitor according to an embodiment.
Figure 6E:
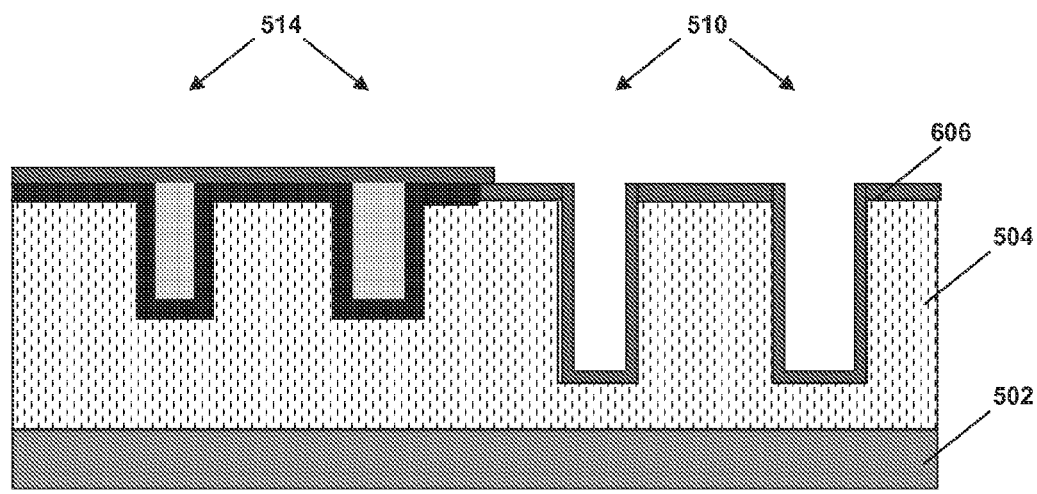
FIG. 6E is a side cross-sectional view of a process stage of forming an integrated bootstrap capacitor according to an embodiment.

With respect to the trench, in embodiments two different etching processes for the capacitor trenches and the transistor trenches, in other words $C_{boost}$ and at least one of high-side transistor 110 or low-side transistor 112, can be used. Deeper trenches generally provide a higher capacitance density, such that one way to have dual trench technologies would be to use two successive lithography steps for etching of the transistor trenches and the capacitor trenches. Referring to FIG. 5, one example embodiment of a process flow is depicted. In FIG. 5A, an epitaxial layer 504 is formed on a substrate layer 502. A hardmask 506, such as an oxide, is applied to layer 504, and a photoresist layer 508 is applied for a first lithography step to be carried out. The spacing in photoresist layer 508, which will become trenches, as well as the dimensions of the openings and eventual trenches themselves can vary from those depicted in FIG. 5. For example, if contacts will be placed on the trenches, then the dimensions of the trenches can be adjusted to be larger or local contact extensions can be used. In FIG. 5B, a photoresist layer 512 has been applied in the area where the second set of trenches for the transistor will be formed, after the first photoresist layer 508 has been removed, and two trenches 510, here for $C_{boost}$, have been etched. In FIG. 5C, a photoresist layer 516 has been applied in the area of trenches 510 while trenches 514 have been etched. In FIG. 5D, hardmask layer 506 has been removed, and the two sets of trenches, 510 for the capacitor and 514 for the transistor, have been formed. In embodiments, the width, depth, configuration and other aspects of trenches 510 and 514 can vary from as depicted and one another, for example reduce or prevent misalignment between trench layers or variations in the critical dimension between trenches 510 and 514 in addition to any dimension desired according to a selected layout.

With respect to the dielectric layer of the capacitor (refer, for example, to FIG. 3 or to capacitor 400 in FIG. 4), optimization in embodiments can relate to a thickness of the layer. In a conventional process of forming of a trench power MOSFET, the dielectric layer forms either the field oxide or the gate oxide. Since the voltage seen by the capacitor is typically lower than the drain-to-source voltage, especially for split gate transistors, a thinner dielectric layer can be beneficial to increase the specific capacitance. Thus, in embodiments, the dielectric layer can be etched at least partially from the capacitor trenches. A deposition or growth of a new dielectric then can follow. In embodiments, and as previously discussed, the dielectric comprises silicon oxide, though other dielectric materials can be used in other embodiments.

The conducting electrode, such as conducting material 428 filling trench 424 in FIG. 4, can comprise a heavily n-doped polysilicon material in embodiments in which the capacitor is integrated with the low-side. In other embodiments, a pn-diode can be formed in trench 424, such that a lower-doped silicon allowing counter-doping, an undoped electrode with undoped silicon deposited and then n- and/or p-doped via implantation, or an electrode with the opposite doping can be used.

Another embodiment of monolithically integrating a capacitor, such as bootstrap capacitor $C_{boost}$, with a trench MOSFET device is depicted in FIG. 6. In the embodiment of FIG. 6, $C_{boost}$ is integrated with the low-side, though high-side integration is also possible depending on whether the p-well is shorted to the n-epitaxial layer or to a separate pad. In embodiments, the p-well can be omitted, rather than shorted, instead. In FIG. 6A, MOSFET trenches 514 and capacitor trenches 510 are depicted after the trench etching. In an embodiment, the trenches are etched using the same hardmask. In FIG. 6B, an oxide layer 602 is deposited or grown. In other embodiments, a dielectric or dielectric stack other than oxide can be used in layer 602, as appreciated by those skilled in the art. In an embodiment, oxide layer 602 can be partially removed, such as in the areas of the capacitor trenches, and a new oxide layer can be deposited or grown. This second oxide layer can be thinner or thicker in embodiments than oxide layer 602, and/or it could also form a different dielectric stack. In FIG. 6C, which can be optional in embodiments, a polysilicon layer 604, such as a p-polysilicon, is deposited and doped, and that doping then diffuses into the main silicon layer 504 to form a p-well 603 (see FIG. 6D). In another embodiment, in-situ doping can be used. In FIG. 6D, oxide layer 602 forms the dielectric and the polysilicon fills trenches 510 to form the field electrode. In an alternative embodiment depicted in FIG. 6E, polysilicon layer 604 is removed, and another oxide layer 606 is formed, such that the field electrode remains in the active trench and the gate electrode can be used for the capacitor. Polysilicon layer 604 also can be removed later and/or need not completely fill trenches 510, in embodiments.

In another embodiment, a field plate can provide mirror charges for charges in the main body of the substrate, allowing higher doping of the body of the substrate and reducing the resistivity of the switched-on device, though such a field plate is used differently or not at all in some embodiments, for example those comprising single poly MOSFETs. In an embodiment, a dielectric, such as the field oxide or gate oxide, is grown or deposited in the transistor trenches, after which a thin layer of thermal oxide can be grown, or a thin tetraethylorthosilicate (TEOS) layer can be deposited, to serve as a defined diffusion barrier for a poly deposition. Between these steps, the initial oxide layer can be at least partially removed in embodiments. An insitu doped poly can be deposited on this thin layer to act as an n- or p-diffusion source and/or as a field plate electrode. After the dope drive to form the capacitor well, the poly can be left as a capacitor electrode or removed. If the poly is removed, the dielectric can be removed from the capacitor trenches as well, after which the capacitor dielectric, such as oxide-nitride-oxide (ONO), can be defined. In embodiments, the steps to form the well are carried out after generation of the field oxide or gate oxide in order to avoid problems related to temperature processing, though in other embodiments these steps can be carried out before rather than after.

Next, creating the bootstrap diode, $D_{boost}$, will be discussed. In embodiments, $D_{boost}$ can be embedded within the capacitor trenches, which can save area. In one embodiment, a standard pn-junction is formed between the electrode of the capacitor, comprising n-doped polysilicon, and a p-doped polysilicon layer. The p-doped polysilicon area can be formed in an embodiment by counter-doping of the n-doped polysilicon or by deposition that can follow an etch of portions of the n-doped polysilicon. In an embodiment of such a pn-junction, an etched trench can be formed in a p-doped polysilicon layer and filled with n-doped silicon. In another embodiment, the dopings can be reversed. A capacitance formed across the space-charge region can then be used as $C_{boost}$.

In embodiments, $D_{boost}$ can comprise an area of about 8,000 square μm, though this is but one example and can be smaller or larger in other embodiments. $R_{DSon}$ of $D_{boost}$ can be about 8 ohms in an embodiment, resulting in a current of about 50 mA, though this is but one example that can vary in other embodiments. The maximum operating, or breakdown, voltage of $D_{boost}$ can be about 28 V in embodiments, though this is but one example, and those skilled in the art will appreciate that these and other dimensions, voltages and other values and characteristics provided herein are examples and are not to be considered to be limiting, as many can be application-dependent or vary according to other factors. These and other characteristics of $D_{boost}$, as well as others provided herein with respect to other components are merely examples and are not to be considered limiting.

Figure 7A:
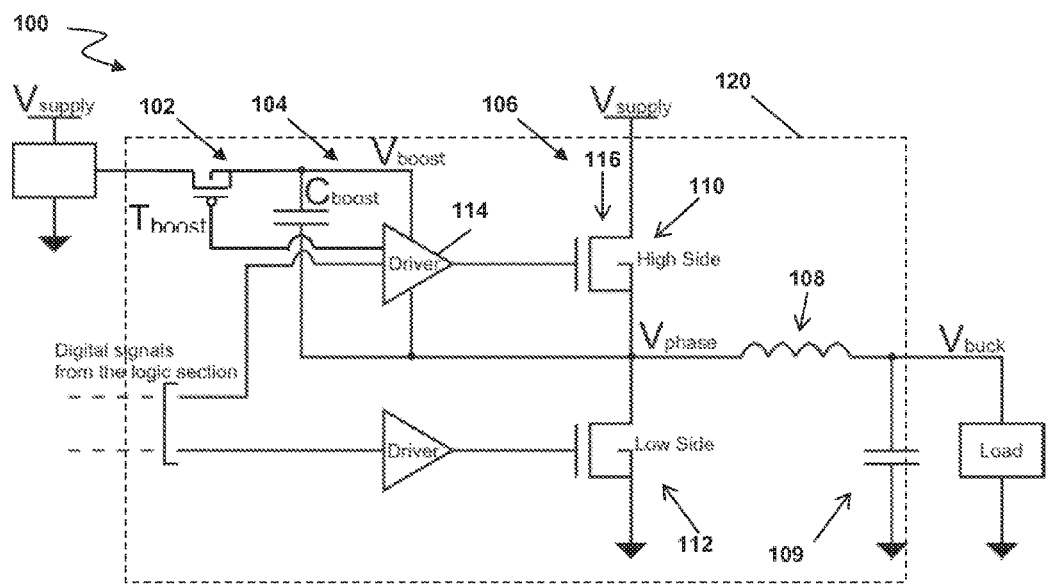
FIG. 7A is a block diagram of a floating driver circuit including a bootstrap circuit according to an embodiment.

In other embodiments, $D_{boost}$ can be replaced by a bootstrap transistor, $T_{boost}$. FIG. 7A depicts circuit 100 of FIG. 1, with $T_{boost}$ replacing $D_{boost}$ according to an embodiment. Other circuit elements are similar or the same as in FIG. 1, though one skilled in the art will appreciate that coupling configurations can be updated accordingly. In an embodiment, $T_{boost}$ comprises a PFET with its drain coupled to $V_{supply}$, source to $C_{boost}$ and gate to driver 114. In other embodiments, $T_{boost}$ comprises some other transistor device coupled in the same or a similarly suitable way, depending upon the particular transistor device used, for example a lateral FET, HEMT comprising GaN, and other suitable devices. Coupled as such, in operation $T_{boost}$ functions similarly to a Schottky diode in embodiments. One advantage of using a MOSFET $T_{boost}$ in embodiments is a lower voltage drop across the transistor than the diode, for example.

Figure 7B:
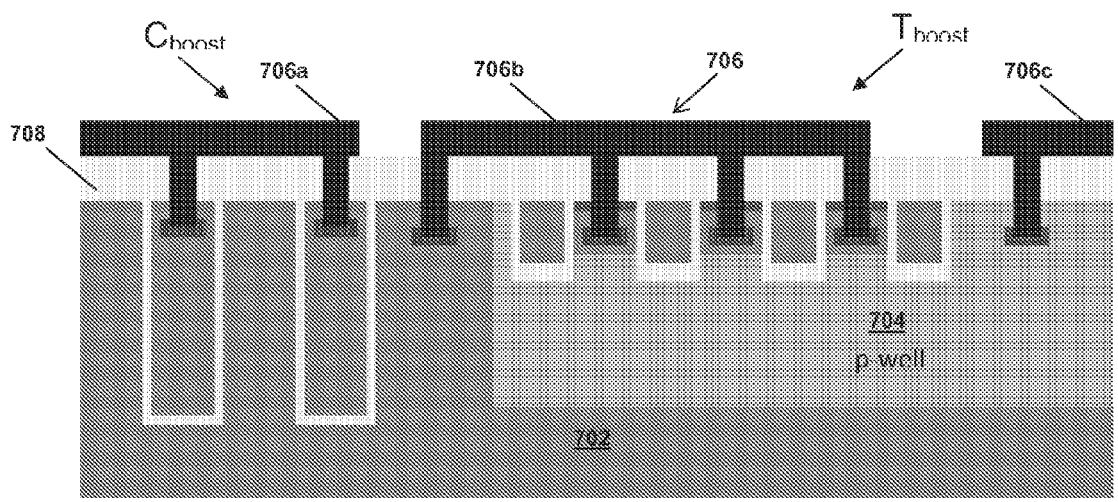
FIG. 7B is a side cross-sectional view of a coupling arrangement of a bootstrap capacitor and a bootstrap transistor according to an embodiment.

Referring also to FIG. 7B, an example embodiment of a monolithic integration of $C_{boost}$ and $T_{boost}$ is depicted. In this embodiment, $T_{boost}$ comprises a pMOS FET. $C_{boost}$ and $T_{boost}$ are formed in a common substrate 702, which in FIG.

7B is n-doped. $T_{boost}$ is formed in p-well 704, which is the drain of $T_{boost}$. Those skilled in the art will appreciate the particular doping configurations can vary in other embodiments, with the embodiment depicted in FIG. 7B being merely one example. Moreover, the depiction in FIG. 7B, as well as in other figures herein, is somewhat simplified, with optimizations and other features not specifically depicted. A metallization layer 706 forms the contacts for the various devices, on a dielectric layer 708. A first contact 706a forms one of two contacts for $C_{boost}$, with the second contact 706b also coupled with the source of $T_{boost}$. Another contact 706c is coupled with p-well 704, the drain of $T_{boost}$.

Figure 7C:
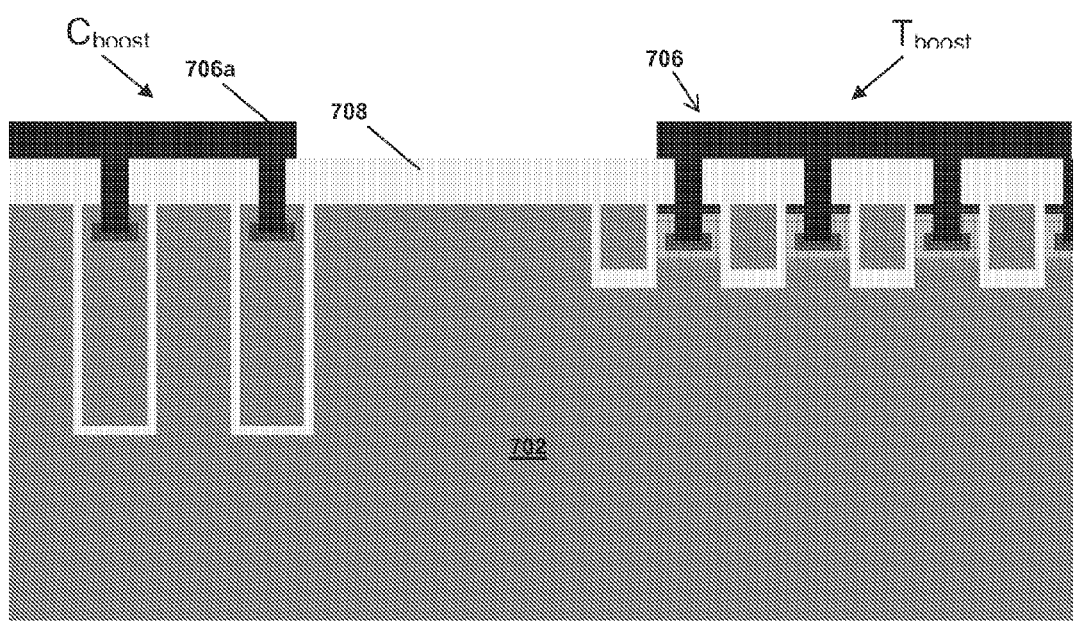
FIG. 7C is a side cross-sectional view of a coupling arrangement of a bootstrap capacitor and a bootstrap transistor according to an embodiment.

Variations of the monolithic integration depicted in FIG. 7B are also possible, such as embodiments in which a backside drain contact is used or other contact configurations are implemented. Additionally, embodiments also can comprise NFETs, as depicted in the example embodiment of FIG. 7C.

Figure 8:
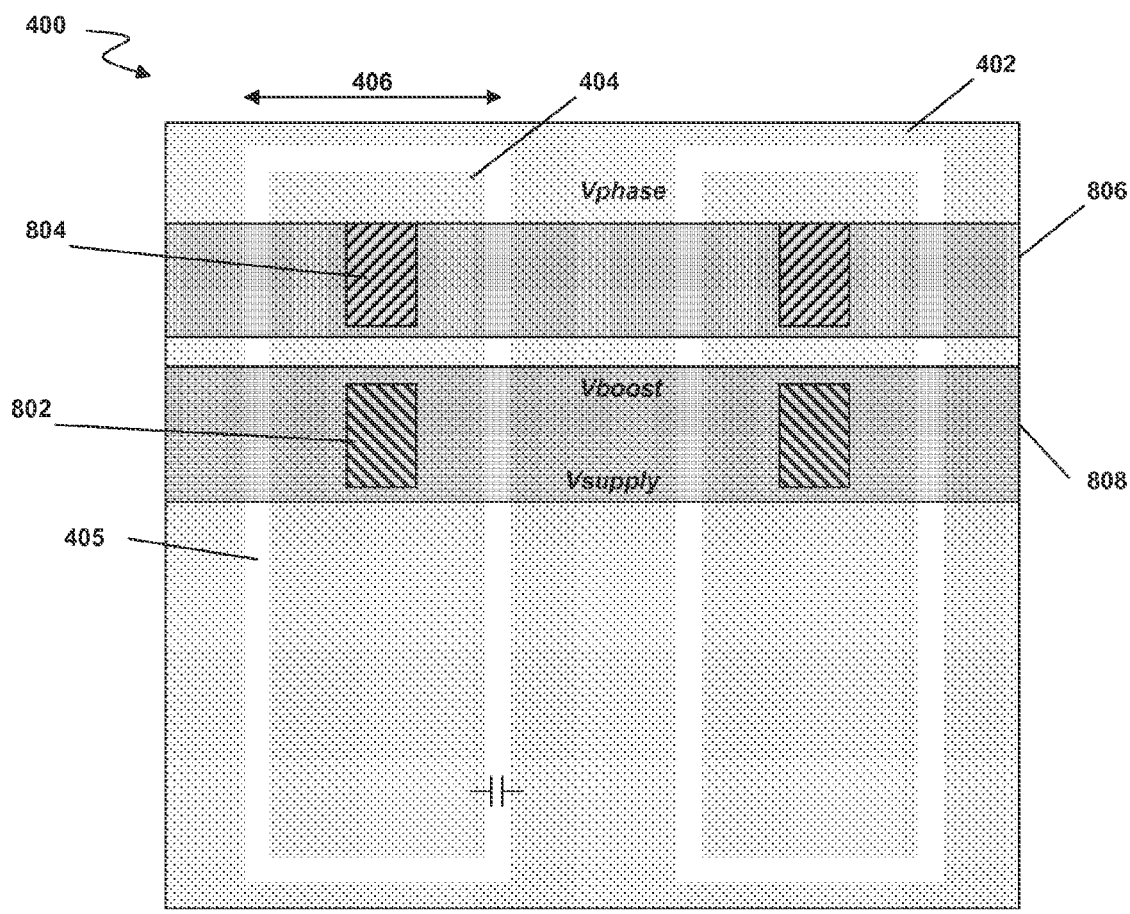
FIG. 8 is a top view of a coupling arrangement of a bootstrap capacitor and diode according to an embodiment.

Returning to bootstrap diode embodiments, a Schottky contact of metal or polysilicon can be formed. One advantage of such an embodiment is a lower forward voltage, which can reduce losses during charging of $C_{boost}$. Such a Schottky contact is depicted in FIG. 8 at 802. Another, Ohmic contact 804 is included for coupling of the metal lines 806 and 808 to pads, pins or other circuit elements. The embodiment of FIG. 8 can be most easily integrated into the low-side, related to that of FIG. 4A, for example, though high-side integration is also possible in embodiments. Reference numerals used in FIG. 4 are used here as well to designate the same or similar portions of the drawings. Additionally, FIG. 8 as well as FIGS. 9 and 10 are not drawn to scale, as the length of trench 406, as well as device 400 overall, can be quite long.

Figure 9:
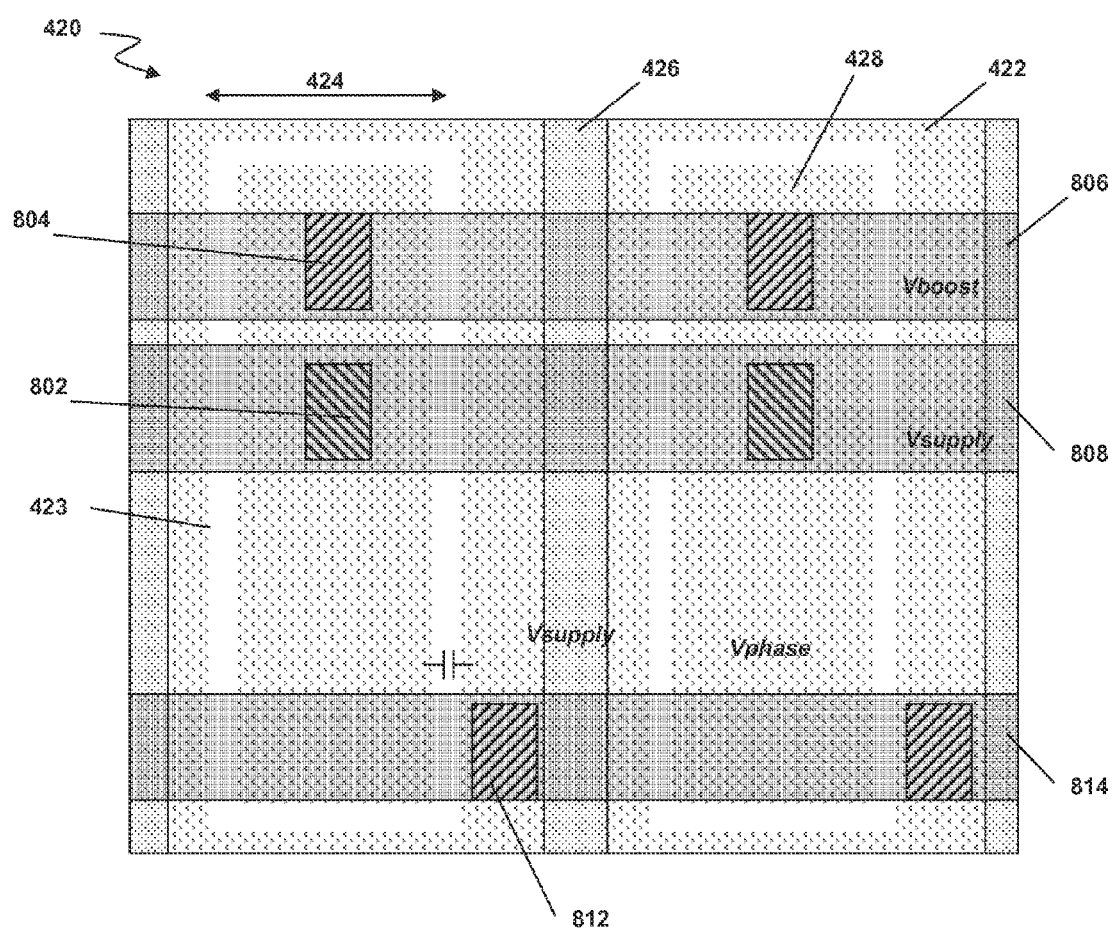
FIG. 9 is a top view of a coupling arrangement of a bootstrap capacitor and diode according to an embodiment.

Another coupling arrangement is depicted in FIG. 9, which is a high-side integration embodiment comprising a trench, comprising an additional well or isolation layer 422 as in FIGS. 4D and 4E, for example. Reference numerals used in FIGS. 4D and 4E are used here as well to designate the same or similar portions of the drawings. A second Ohmic contact 812 as well as a third metal line 814 are also included to provide the additional coupling needed to the second electrode. Refer, for example, to FIGS. 4D and 4E and the discussion related to high-side integration embodiments. In another high-side integration embodiment not depicted, a single well 422 is implemented for both trenches 428 and can comprise a single contact.

Figure 10:
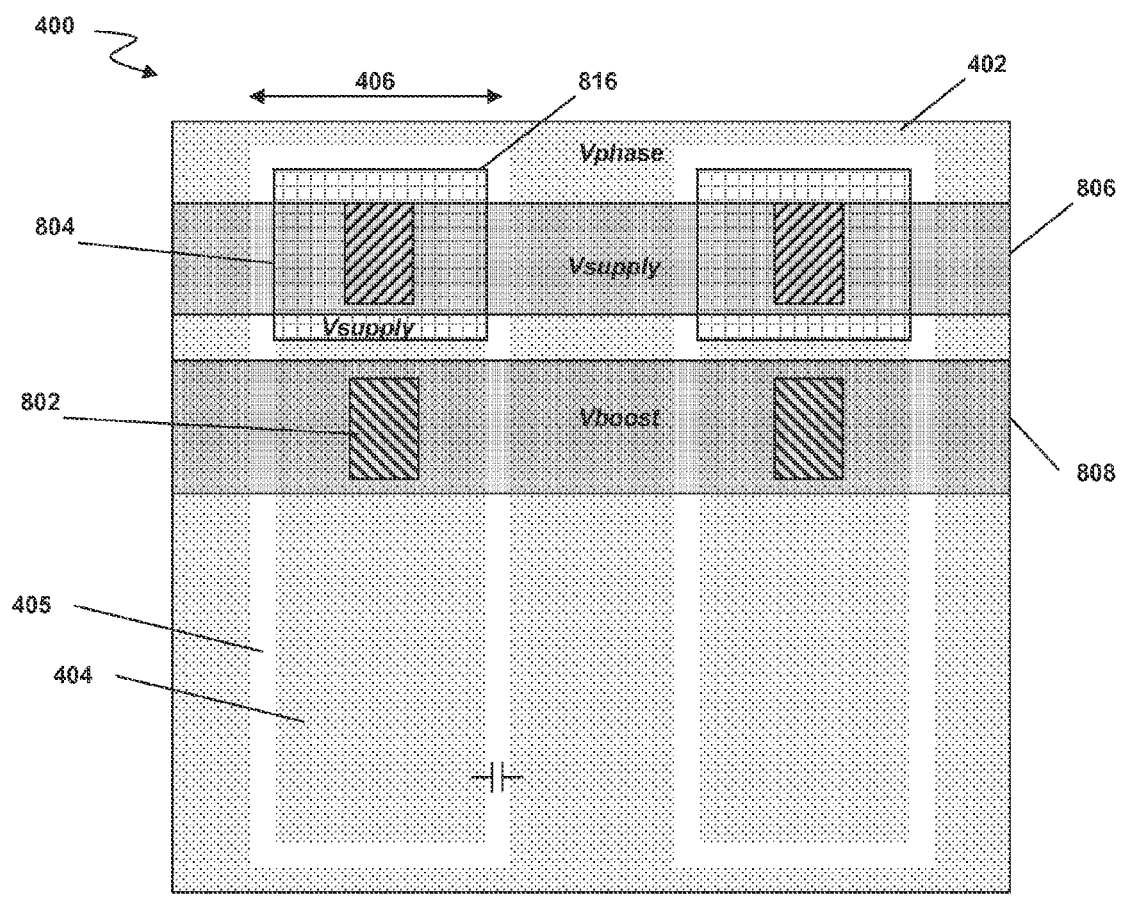
FIG. 10 is a top view of a coupling arrangement of a bootstrap capacitor and diode according to an embodiment.

In FIG. 10, yet another coupling arrangement is depicted, in which both contacts 802 and 804 are Ohmic, and a doped area 816 surrounds one of the contacts 802. For example, if the substrate 426 is n-doped, then doped area 816 is p-doped. Or, if substrate 426 is p-doped, then doped area 816 is n-doped. Doped area 816 can comprise a smaller portion of trench 406, as depicted in FIG. 10, or the counterdoping can fill a larger portion of trench 406 in other embodiments.

In FIGS. 8-10, the particular placement of contacts, such as contacts 802, 804 and 812 can vary in embodiments, with the positions and placements depicted being mere examples. Those skilled in the art will appreciate this, as well as that different contact placement can influence or determine the placement of other elements, such as doped areas and the like.

Embodiments provide numerous improvements upon and advantages over conventional approaches. For example, integrating the bootstrap circuitry monolithically and/or in the same package as other circuit elements in accordance with one or more embodiments discussed herein can provide reduced circuit element sizes, which in turn can reduce the gate charge to improve switching losses. As frequencies increase, components generally must be become smaller, which can provide opportunities for applications. Moreover, integrating the bootstrap circuitry provides simplified design, reduced area requirements, decreased parasitic and, because of one or more of these, reduced costs. Advantages are also provided with respect to conventional system-in-package or module approaches, which require additional space and complexity and do not offer the higher level of integration the semiconductor-based, integrated circuit embodiments can provide.

Embodiments also relate more generally to integration, including monolithic integration, of semiconductor-based capacitors and other elements with power transistors. While those capacitors and other elements can comprise or form part of a bootstrap circuit, they also can comprise other, non-bootstrap elements. This integration provides advantages over conventional approaches, including those which simply use a system-in-package configuration of modules without further integration, such as monolithic integration. Thus, embodiments depicted and discussed herein with respect to bootstrap circuits or elements also apply more generally to circuit element integration with power transistors and other devices, regardless of whether those circuit elements are bootstrap circuit elements or not, and examples related to bootstrap circuits, including bootstrap capacitors, bootstrap diodes, and bootstrap transistors, are not to be limiting.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An integrated circuit comprising:
 a floating driver circuit, the floating driver circuit comprising a high side portion, a low side portion, at least one transistor device, and a bootstrap circuit, wherein the bootstrap circuit is integrated on a same die with one of the high side portion or the low side portion and coupled with the at least one transistor device, and wherein, the bootstrap circuit comprises a semiconductor-based bootstrap capacitor device.

2. The integrated circuit of claim 1, wherein the at least one transistor device comprises a power transistor device.

3. The integrated circuit of claim 1, wherein the at least one transistor device comprises one of a metal-oxide-semiconductor field effect transistor (MOSFET) device.

4. The integrated circuit of claim 1, wherein the at least one transistor device comprises a first transistor that is part of the high side portion, the integrated circuit further comprising a second transistor, coupled to the bootstrap circuit, that is part of the low side portion, and wherein the high side portion and the low side portion are integrated on different die of the integrated circuit.

5. The integrated circuit of claim 1, wherein the at least one transistor device comprises at least one of gallium nitride (GaN) or silicon carbide (SiC).

6. The integrated circuit of claim 1, wherein the bootstrap circuit is monolithically formed with the at least one transistor device.

7. The integrated circuit of claim 1, wherein the bootstrap capacitor device comprises a trench formed in a silicon substrate, and wherein a first electrode of the bootstrap capacitor device comprises the silicon substrate and a second electrode of the bootstrap capacitor device comprises a conductive material within and separated from the trench by a dielectric layer.

8. The integrated circuit of claim 1, wherein the bootstrap capacitor device comprises a trench formed in a silicon substrate, and wherein a doped well surrounds the trench and forms a first electrode of the bootstrap capacitor device, and a second electrode of the bootstrap capacitor device comprises a conductive material within and separated from the trench by a dielectric layer.

9. The integrated circuit of claim 1, wherein the bootstrap circuit comprises one of a bootstrap diode device or a bootstrap transistor device.

10. The integrated circuit of claim 9, wherein the bootstrap circuit comprises the bootstrap transistor device, and wherein the bootstrap transistor device comprises a MOSFET device.

11. The integrated circuit of claim 9, wherein the bootstrap circuit comprises the bootstrap diode device, and wherein the bootstrap diode device comprises a Schottky diode device.

12. A method comprising:
 forming at least one transistor device within a floating driver circuit;
 forming a high side portion within the floating driver circuit;
 forming a low side portion within the floating driver circuit; and
 forming a semiconductor-based bootstrap capacitor element within the floating driver circuit, wherein forming the bootstrap capacitor comprises integrating the bootstrap capacitor element on a same die with one of the high side portion or the low side portion and coupling the bootstrap capacitor with the at least one transistor device.

13. The method of claim 12, wherein forming at least one transistor device comprises forming at least one power transistor device.

14. The method of claim 13, wherein the at least one power transistor device comprises at least one of a metal-oxide-silicon field effect transistor (MOSFET) device, a silicon carbide (SiC) transistor device or a gallium nitride (GaN) transistor device.

15. The method of claim 14, wherein forming the semiconductor-based bootstrap capacitor element comprises:
 forming a well of the bootstrap capacitor as part of a process of forming the MOSFET device by driving a doping of a first type through a dielectric layer and into a silicon substrate having a doping of a second type different from the first type.

16. The method of claim 15, further comprising removing the dielectric layer.

17. The method of claim 12, wherein forming a semiconductor-based bootstrap capacitor element further comprises forming at least one of a bootstrap transistor or a bootstrap diode monolithically with the at least one transistor device.

18. The method of claim 12, wherein forming a semiconductor-based bootstrap capacitor element further comprises etching at least one trench in a silicon substrate, and wherein forming at least one transistor device further comprises etching at least one trench in the silicon substrate, wherein the at least one trench of the bootstrap capacitor element and the at least one trench of the at least one transistor device are etched to different depths of the silicon substrate.

19. The method of claim 18, further comprising using the same hardmask to etch the at least one trench of the bootstrap capacitor element and the at least one trench of the at least one transistor device.

* * * * *